US010332900B2

(12) United States Patent
Yun et al.

(10) Patent No.: US 10,332,900 B2
(45) Date of Patent: Jun. 25, 2019

(54) VERTICAL MEMORY DEVICES

(71) Applicant: SAMSUNG ELECTRONICS CO., LTD., Suwon-si, Gyeonggi-do (KR)

(72) Inventors: Su-Ok Yun, Suwon-si (KR); Jang-Gn Yun, Hwaseong-si (KR); Joon-Sung Lim, Yongin-si (KR); Sung-Min Hwang, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/801,551

(22) Filed: Nov. 2, 2017

(65) Prior Publication Data
US 2018/0247950 A1 Aug. 30, 2018

(30) Foreign Application Priority Data
Feb. 27, 2017 (KR) .................. 10-2017-0025279

(51) Int. Cl.
H01L 21/28 (2006.01)
H01L 27/115 (2017.01)
H01L 23/522 (2006.01)
H01L 23/535 (2006.01)
H01L 29/423 (2006.01)
H01L 29/49 (2006.01)
H01L 27/11556 (2017.01)
H01L 27/11582 (2017.01)
H01L 27/11568 (2017.01)
H01L 27/11573 (2017.01)
H01L 27/11575 (2017.01)

(52) U.S. Cl.
CPC .. H01L 27/11556 (2013.01); H01L 27/11568 (2013.01); H01L 27/11573 (2013.01); H01L 27/11575 (2013.01); H01L 27/11582 (2013.01)

(58) Field of Classification Search
CPC ......... H01L 27/11582; H01L 27/11524; H01L 27/11556; H01L 27/1157; H01L 21/3065; H01L 29/7883; H01L 21/30604
See application file for complete search history.

(56) References Cited

U.S. PATENT DOCUMENTS 9,362,306 B2    6/2016 Park et al.
9,449,987 B1    9/2016 Miyata et al.
2011/0291168 A1* 12/2011 Iwasa ................ H01L 27/10873
                                                       257/296
2012/0083076 A1*  4/2012 Wang ................ H01L 21/28194
                                                       438/151

(Continued)

Primary Examiner — Brian Turner
(74) Attorney, Agent, or Firm — Lee & Morse, P.C.

(57) ABSTRACT

A vertical memory device includes a gate structure on a peripheral circuit region of a substrate, the substrate including a cell region and the peripheral circuit region, and the gate structure including a first gate electrode, second, third, and fourth gate electrodes sequentially disposed at a plurality of levels, respectively, on the cell region of the substrate in a vertical direction substantially perpendicular to an upper surface of the substrate, a first epitaxial layer extending through the second gate electrode on the cell region of the substrate, a channel extending through the third and fourth gate electrodes in the vertical direction on the first epitaxial layer, and a second epitaxial layer on a portion of the peripheral circuit region of the substrate adjacent the gate structure.

20 Claims, 14 Drawing Sheets

(56) References Cited

U.S. PATENT DOCUMENTS

| | | | |
|---|---|---|---|
| 2013/0146990 A1 | 6/2013 | Park | |
| 2013/0228843 A1* | 9/2013 | Lim | H01L 29/788 |
| | | | 257/315 |
| 2014/0199815 A1* | 7/2014 | Hwang | H01L 29/66833 |
| | | | 438/270 |
| 2015/0348987 A1* | 12/2015 | Lee | H01L 27/11573 |
| | | | 257/326 |
| 2016/0043100 A1* | 2/2016 | Lee | H01L 27/11565 |
| | | | 257/324 |
| 2016/0049423 A1* | 2/2016 | Yoo | H01L 27/11582 |
| | | | 257/324 |
| 2016/0163686 A1 | 6/2016 | Lee et al. | |
| 2016/0268264 A1 | 9/2016 | Hwang et al. | |
| 2016/0293625 A1 | 10/2016 | Kang et al. | |
| 2017/0358594 A1* | 12/2017 | Lu | H01L 27/11582 |
| 2018/0012899 A1* | 1/2018 | Cheng | H01L 21/28273 |

\* cited by examiner

VERTICAL MEMORY DEVICES

CROSS-REFERENCE TO RELATED APPLICATIONS

Korean Patent Application No. 10-2017-0025279, filed on Feb. 27, 2017, in the Korean Intellectual Property Office, and entitled: "Vertical Memory Devices," is incorporated by reference herein in its entirety.

BACKGROUND

1. Field

Embodiments relate to vertical memory devices.

2. Description of the Related Art

A semiconductor pattern serving as a channel of a transistor including a GSL in a cell region of a VNAND flash memory device may be formed by a selective epitaxial growth (SEG) process. It is required to develop a method of forming an epitaxial layer serving as a source/drain layer in a peripheral circuit region of the VNAND flash memory device.

SUMMARY

According to an aspect of embodiments, there is provided a vertical memory device. The vertical memory device may include a gate structure, second, third and fourth gate electrodes, a first epitaxial layer, a channel, and a second epitaxial layer. The gate structure may be formed on a peripheral circuit region of a substrate, and may include a first gate electrode. The substrate may include a cell region and the peripheral circuit region. The second, third and fourth gate electrodes may be sequentially disposed at a plurality of levels, respectively, on the cell region of the substrate in a vertical direction substantially perpendicular to an upper surface of the substrate. The first epitaxial layer may extend through the second gate electrode on the cell region of the substrate. The channel may extend through the third and fourth gate electrodes in the vertical direction on the first epitaxial layer. The second epitaxial layer may be formed on a portion of the peripheral circuit region of the substrate adjacent the gate structure.

According to an aspect of embodiments, there is provided a vertical memory device. The vertical memory device may include a gate structure, a source/drain layer, second, third and fourth gate electrodes, a lower channel, and an upper channel. The gate structure may be formed on a peripheral circuit region of a substrate, and may include a first gate electrode. The substrate may include a cell region and the peripheral circuit region. The source/drain layer may be formed on a portion of the peripheral circuit region of the substrate adjacent the gate structure. The second, third and fourth gate electrodes may be sequentially disposed at a plurality of levels, respectively, on the cell region of the substrate in a vertical direction substantially perpendicular to an upper surface of the substrate. The lower channel may extend through the second gate electrode on the cell region of the substrate. The upper channel may extend through the third and fourth gate electrodes in the vertical direction on the lower channel. The lower channel and the source/drain layer may include substantially the same material.

According to an aspect of embodiments, there is provided a vertical memory device. The vertical memory device may include a substrate including a cell region and a peripheral circuit region, a gate structure on the peripheral circuit region of the substrate, the gate structure including a first gate electrode, second, third, and fourth gate electrodes on the cell region of the substrate, the second through fourth gate electrodes being spaced apart from each other along a vertical direction substantially perpendicular to an upper surface of the substrate, a first epitaxial layer extending through the second gate electrode on the cell region of the substrate, a channel on the first epitaxial layer, the channel extending through the third and fourth gate electrodes in the vertical direction, and a second epitaxial layer on the peripheral circuit region of the substrate, the second epitaxial layer being adjacent the gate structure and consisting essentially of a same material as the first epitaxial layer.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 6:
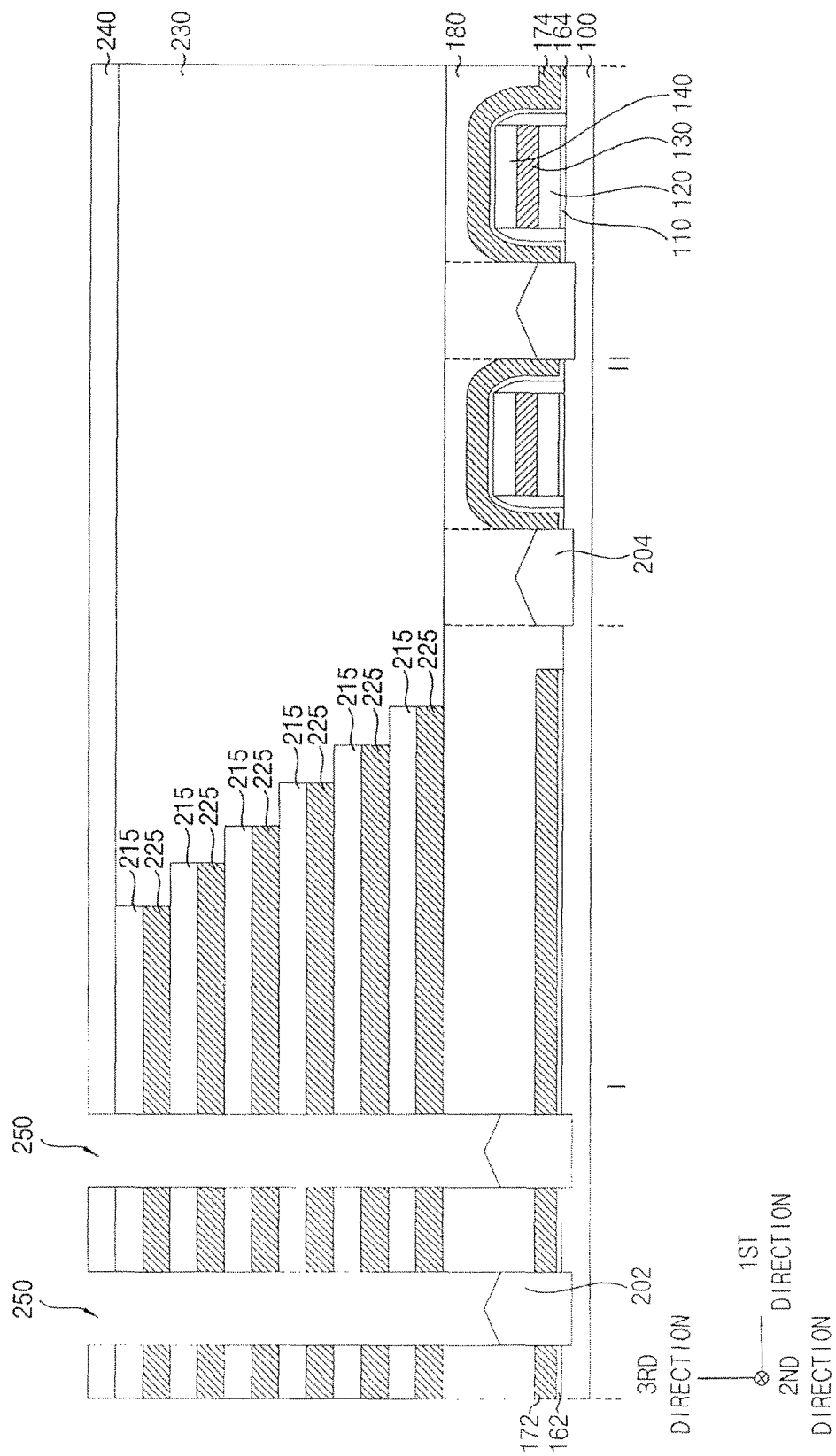
Figure 7:
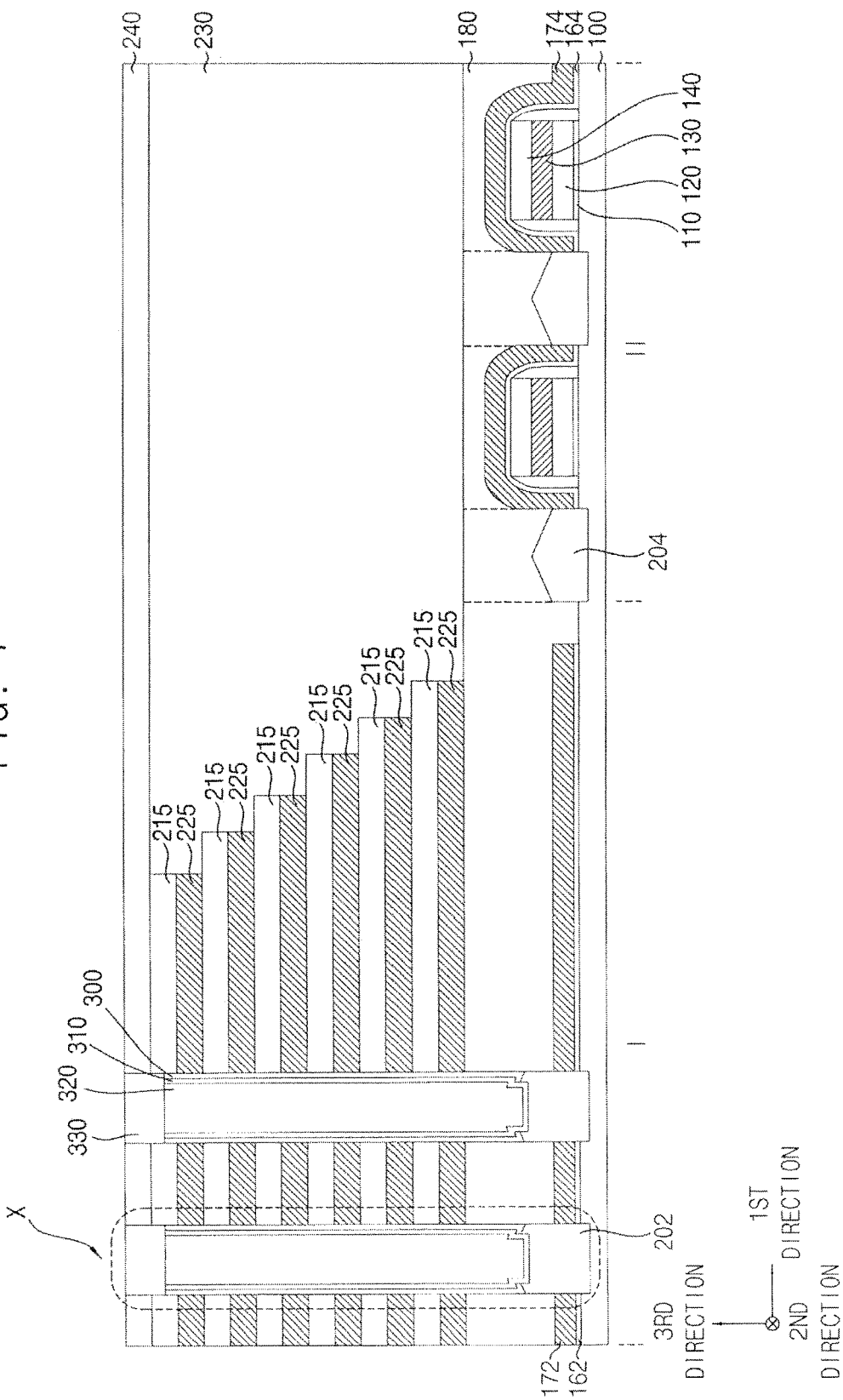
Figure 8:
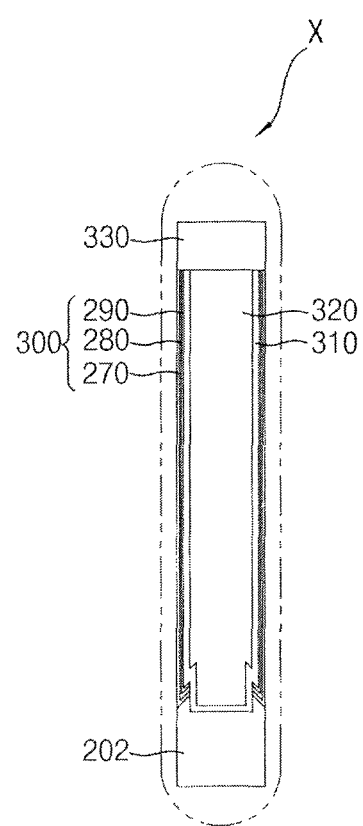

FIGS. 1 to 10 are cross-sectional views illustrating stages of a method of manufacturing a vertical memory device in accordance with example embodiments. FIG. 8 is an enlarged cross-sectional view of a region X in FIG. 7.

Hereinafter, two directions substantially parallel to an upper surface of a substrate and crossing each other may be referred to as first and second directions, respectively, and a direction substantially perpendicular to the upper surface of the substrate may be referred to as a third direction. In example embodiments, the first and second directions may be substantially perpendicular to each other.

Figure 1:
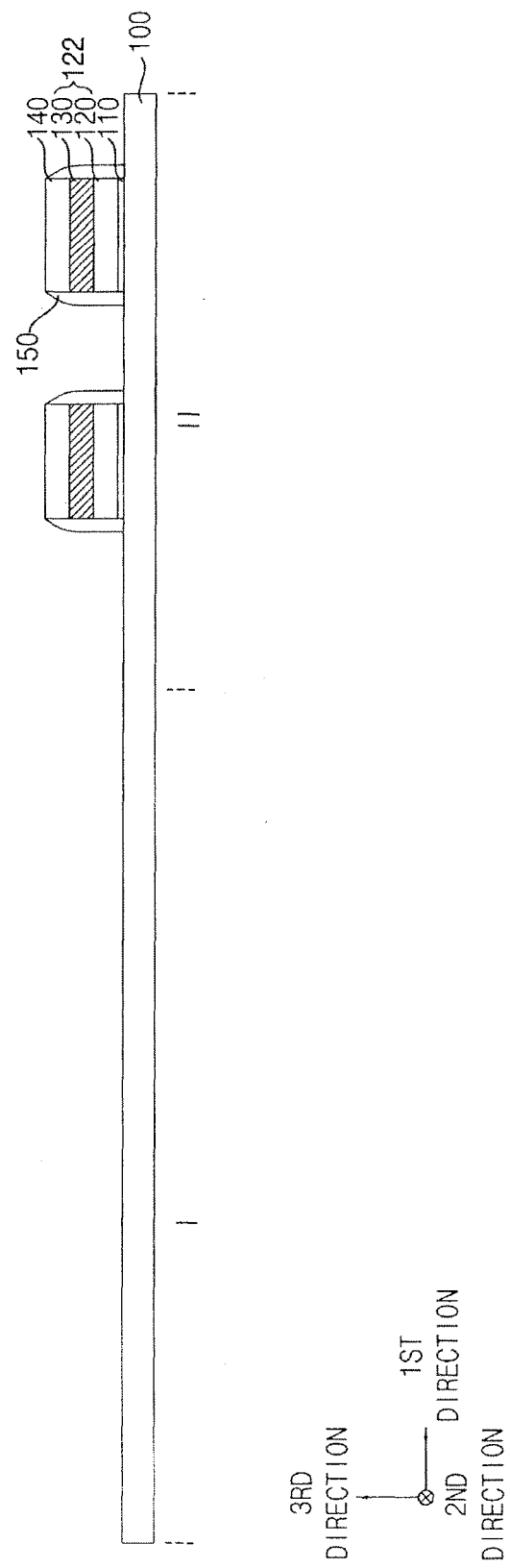
FIGS. 1 to 10 illustrate cross-sectional views of stages in a method of manufacturing a vertical memory device in accordance with example embodiments.

Referring to FIG. 1, a first gate structure and a gate spacer 150 may be formed on a second region II of a substrate 100. The substrate 100 may include a first region I and the second region II.

For example, the substrate 100 may include silicon, germanium, silicon-germanium or a III-V compound, e.g., GaP, GaAs, GaSb, etc. In some embodiments, the substrate 100 may be a silicon-on-insulator (SOI) substrate or a germanium-on-insulator (GOI) substrate. In example embodiments, the first and second regions I and II of the substrate 100 may serve as a cell region and a peripheral circuit region of the vertical memory device.

The first gate structure may be formed on the substrate 100 by sequentially forming a gate insulation layer, a polysilicon layer, a metal layer, and a gate mask layer on the substrate 100, followed by patterning the layers. Thus, the first gate structure may include a gate insulation pattern 110, a first polysilicon pattern 120, a first metal pattern 130, and a first gate mask 140 sequentially stacked on the substrate 100. The first polysilicon pattern 120 and the first metal pattern 130 may define a first gate electrode 122.

The gate spacer 150 may be formed by forming a gate spacer layer on the substrate 100 to cover the first gate structure, and anisotropically etching the gate spacer layer. Thus, the gate spacer 150 may be formed on a sidewall of the first gate structure.

The gate insulation pattern 110 may be formed of an oxide, e.g., silicon oxide, the first polysilicon pattern 120 may be formed of polysilicon doped with p-type or n-type impurities, the first metal pattern 130 may be formed of a metal, e.g., tungsten, tantalum, titanium, etc., and the first gate mask 140 may be formed of an oxide, e.g., silicon oxide. The gate spacer 150 may be formed of an oxide, e.g., silicon oxide, and thus may be merged with the first gate mask 140 and/or the gate insulation pattern 110.

Figure 2:
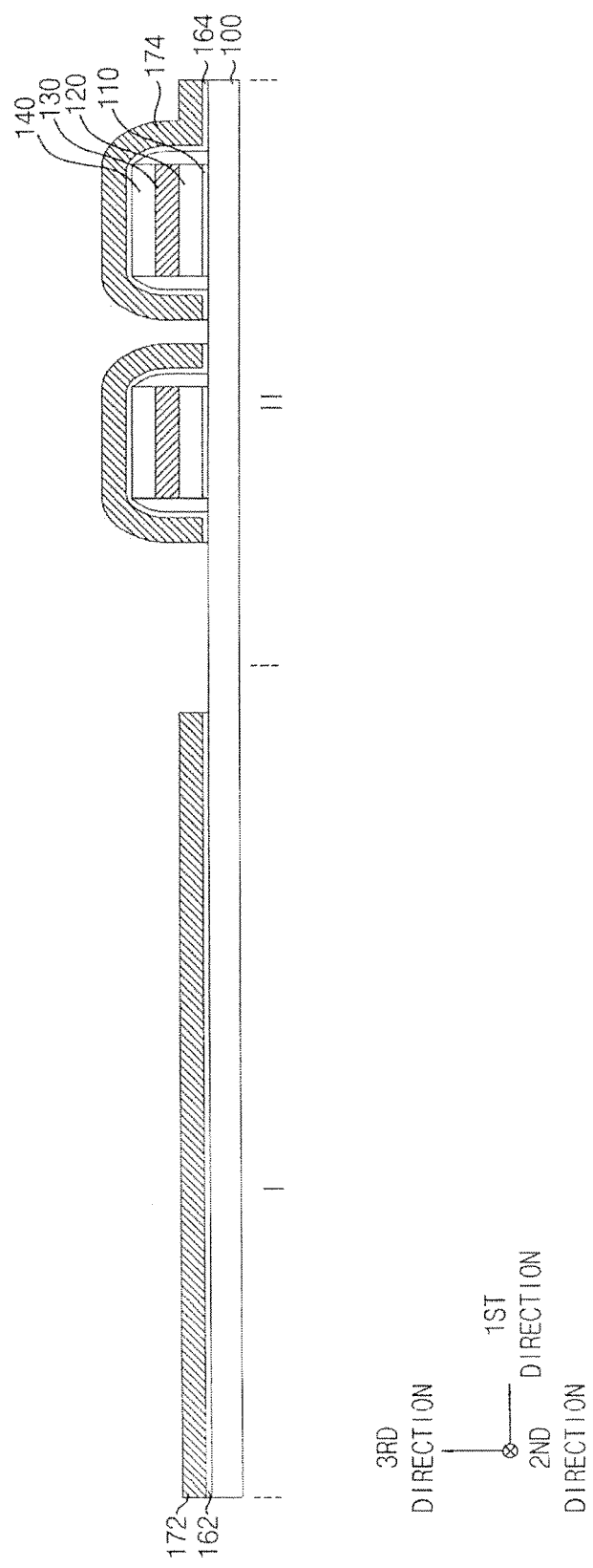

Referring to FIG. 2, a first insulation layer and an etch stop layer may be sequentially formed on the substrate 100 to cover the first gate structure. Next, the first insulation layer and etch stop layer may be patterned to form a first insulation pattern 162 and a first sacrificial pattern 172 sequentially stacked on the first region I of the substrate 100, and a second insulation pattern 164 and an etch stop pattern 174 sequentially stacked on the second region II of the substrate 100. In example embodiments, the first insulation pattern 162 and the first sacrificial pattern 172 may have a rectangular shape on the first region I of the substrate 100 in a plan view, and the second insulation pattern 164 and the etch stop pattern 174 may cover the first gate structure on the second region II of the substrate 100.

The first insulation layer may be formed of an oxide, e.g., silicon oxide, and thus may be merged with the first gate mask 140 and/or the gate spacer 150. The etch stop layer may be formed of a nitride, e.g., silicon nitride. Impurities may be implanted into an upper portion of the second region II of the substrate 100 not covered by the second insulation pattern 164 and the etch stop pattern 174 to form a first impurity region.

Figure 3:
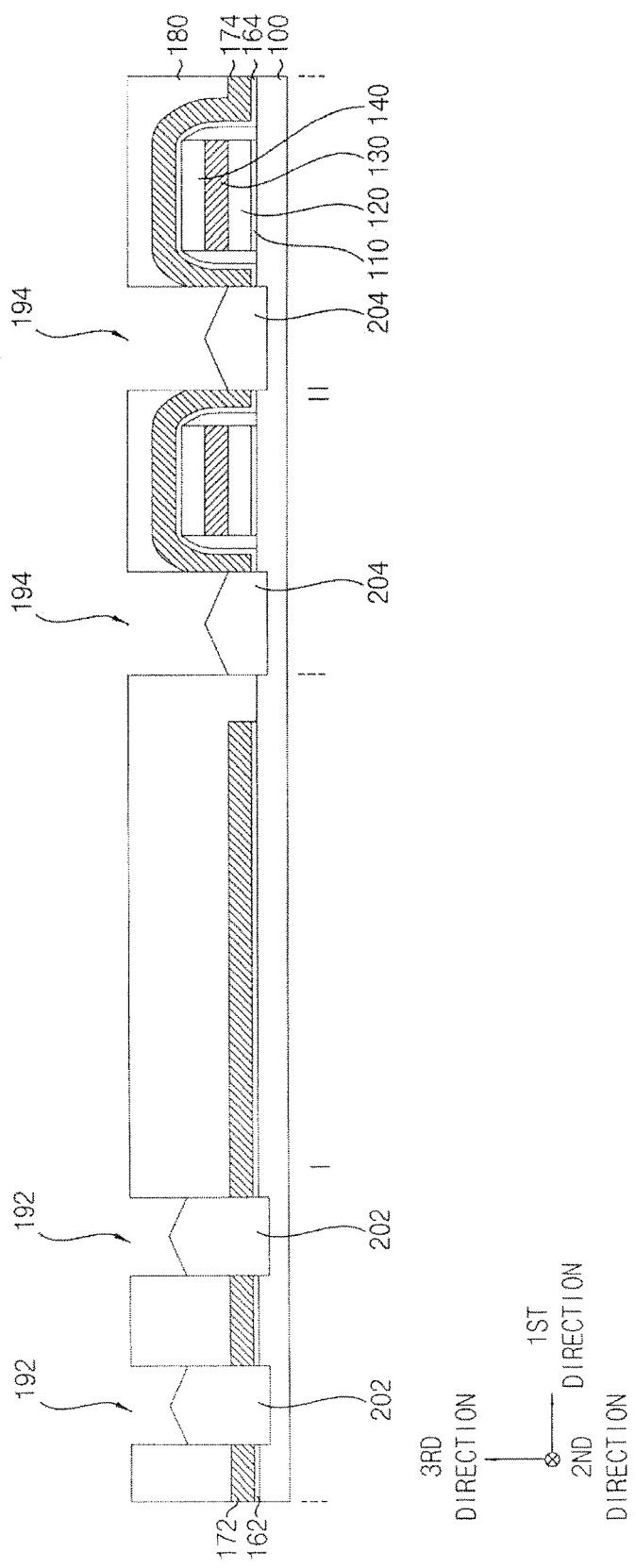

Referring to FIG. 3, after a first insulating interlayer 180 is formed on the substrate 100 to cover the first and second insulation patterns 162 and 164, the first sacrificial pattern 172, and the etch stop pattern 174, a portion of the first insulating interlayer 180 on the first region I of the substrate 100 and portions of the first sacrificial pattern 172 and the first insulation pattern 162 thereunder may be removed to form a first opening 192 exposing the first region I of the substrate 100, and a portion of the first insulating interlayer 180 on the second region II of the substrate 100 may be removed to form a second opening 194 exposing the second region II of the substrate 100. That is, the second opening 194 may be formed on the second region II of the substrate 100 by removing a portion of the first insulating interlayer 180 adjacent to the first gate structure, i.e., a portion of the first insulating interlayer 180 under which the second insulation pattern 164 and the etch stop pattern 174 are not formed.

In example embodiments, a plurality of first openings 192 may be formed in the first and second directions, and thus a first opening array may be formed. In example embodiments, when the first and second openings 192 and 194 are formed, upper portions of the first and second regions I and II of the substrate 100 may be also removed.

A selective epitaxial growth (SEG) process may be performed to form first and second epitaxial layers 202 and 204 partially filling the first and second openings 192 and 194, respectively. The first and second epitaxial layers 202 and 204 may be formed, e.g., simultaneously, by the same SEG process.

In example embodiments, the SEG process may be performed by providing, e.g., a silicon source gas, a germanium source gas, an etching gas, and a carrier gas onto the substrate 100. The SEG process may be performed using e.g., silane gas (SiH$_4$) gas, disilane (Si$_2$H$_6$) gas, dichlorosilane (SiH$_2$Cl$_2$) gas, etc., as the silicon source gas, using e.g., germane (GeH$_4$) gas as the germanium source gas, using e.g., hydrogen chloride (HCl) gas as the etching gas, and using e.g., hydrogen (H$_2$) gas as the carrier gas. Thus, a single crystalline silicon-germanium layer may be formed as each of the first and second epitaxial layers 202 and 204.

For example, the SEG process may be performed using p-type impurity source gas, e.g., diborane (B$_2$H$_6$) gas, to form a single crystalline silicon-germanium layer doped with p-type impurities as each of the first and second epitaxial layers 202 and 204. In another example, p-type impurities may be doped into only the second epitaxial layer 204 by an independent doping process, and thus the second epitaxial layer 204 may serve as a source/drain layer of a positive-channel metal oxide semiconductor (PMOS) transistor.

In another example, the SEG process may be performed by providing a silicon source gas, a carbon source gas, an etching gas, and a carrier gas onto the substrate 100, and thus a single crystalline silicon carbide layer may be formed as each of the first and second epitaxial layers 202 and 204. The SEG process may be performed using e.g., silane gas (SiH$_4$) gas, disilane (Si$_2$H$_6$) gas, dichlorosilane (SiH$_2$Cl$_2$) gas, etc., as the silicon source gas, using e.g., SiH$_3$CH$_3$ gas as the carbon source gas, using e.g., hydrogen chloride (HCl) gas as the etching gas, and using e.g., hydrogen (H$_2$) gas as the carrier gas.

In yet another example, the SEG process may be performed using a silicon source gas, an etching gas, and a carrier gas, and thus a single crystalline silicon layer may be formed as each of the first and second epitaxial layers 202 and 204.

In yet another example, the SEG process may be performed using n-type impurity source gas, e.g., phosphine (PH$_3$) gas, to form a single crystalline silicon carbide layer doped with n-type impurities or a single crystalline silicon layer doped with n-type impurities as each of the first and second epitaxial layers 202 and 204. Alternatively, n-type impurities may be doped into only the second epitaxial layer 204 by an independent doping process, and thus the second epitaxial layer 204 may serve as a source/drain layer of a negative-channel metal oxide semiconductor (NMOS) transistor.

In example embodiments, an upper surface of the first epitaxial layer 202 may be higher than that of the second epitaxial layer 204. However, embodiments are not limited thereto.

Figure 4:
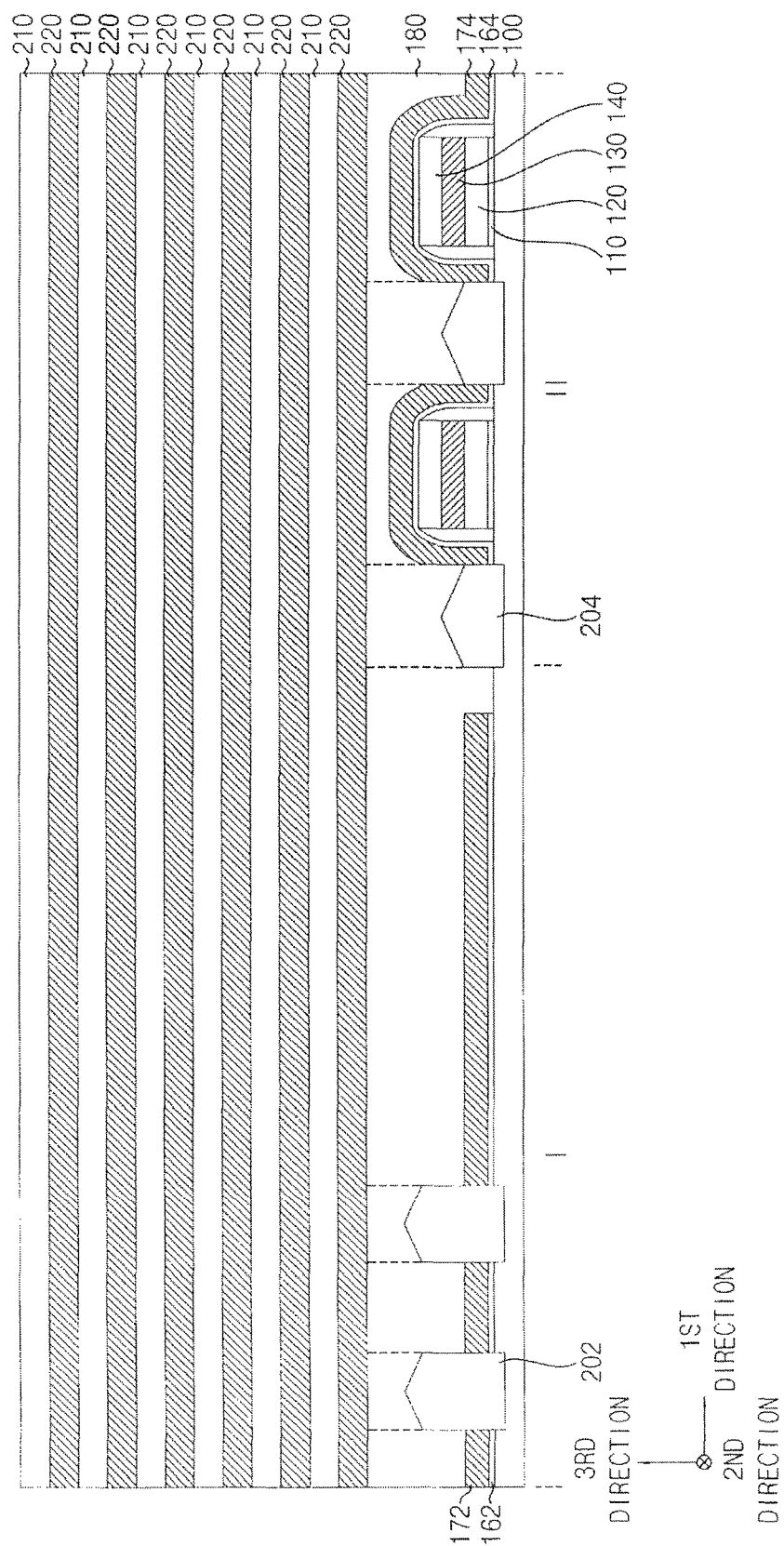

Referring to FIG. 4, a second insulating interlayer may be formed on the first and second epitaxial layers 202 and 204 and the first insulating interlayer 180 to fill remaining portions of the first and second openings 192 and 194, and may be planarized. The planarization process may include, e.g., a chemical mechanical polishing (CMP) process and/or an etch back process.

In example embodiments, the second insulating interlayer may be formed of substantially the same material as that of the first insulating interlayer 180, e.g., silicon nitride, and thus may be merged with the first insulating interlayer 180. Hereinafter, the second insulating interlayer may not be shown in figures independently from the first insulating interlayer 180.

A sacrificial layer 220 and a second insulation layer 210 may be alternately and repeatedly formed on the first insulating interlayer 180. Thus, a plurality of sacrificial layers 220 and a plurality of second insulation layers 210 may be alternately stacked on each other in the third direction. FIG. 4 shows for purposes of illustration sacrificial layers 220 and second insulation layers 210 alternately stacked. However, embodiments are not limited to any particular number of the sacrificial layers 220 and the second insulation layers 210.

The second insulation layers 210 and the sacrificial layers 220 may be formed by, e.g., a chemical vapor deposition (CVD) process, a plasma enhanced chemical vapor deposition (PE-CVD) process, an atomic layer deposition (ALD) process, etc. The second insulation layer 210 may be formed of a silicon oxide, e.g., plasma enhanced tetraethylorthosilicate (PE-TEOS), high density plasma (HDP) oxide, plasma enhanced oxide (PEOX), etc. The sacrificial layers 220 may be formed of a material having an etching selectivity with respect to the second insulation layers 210, e.g., silicon nitride.

Figure 5:
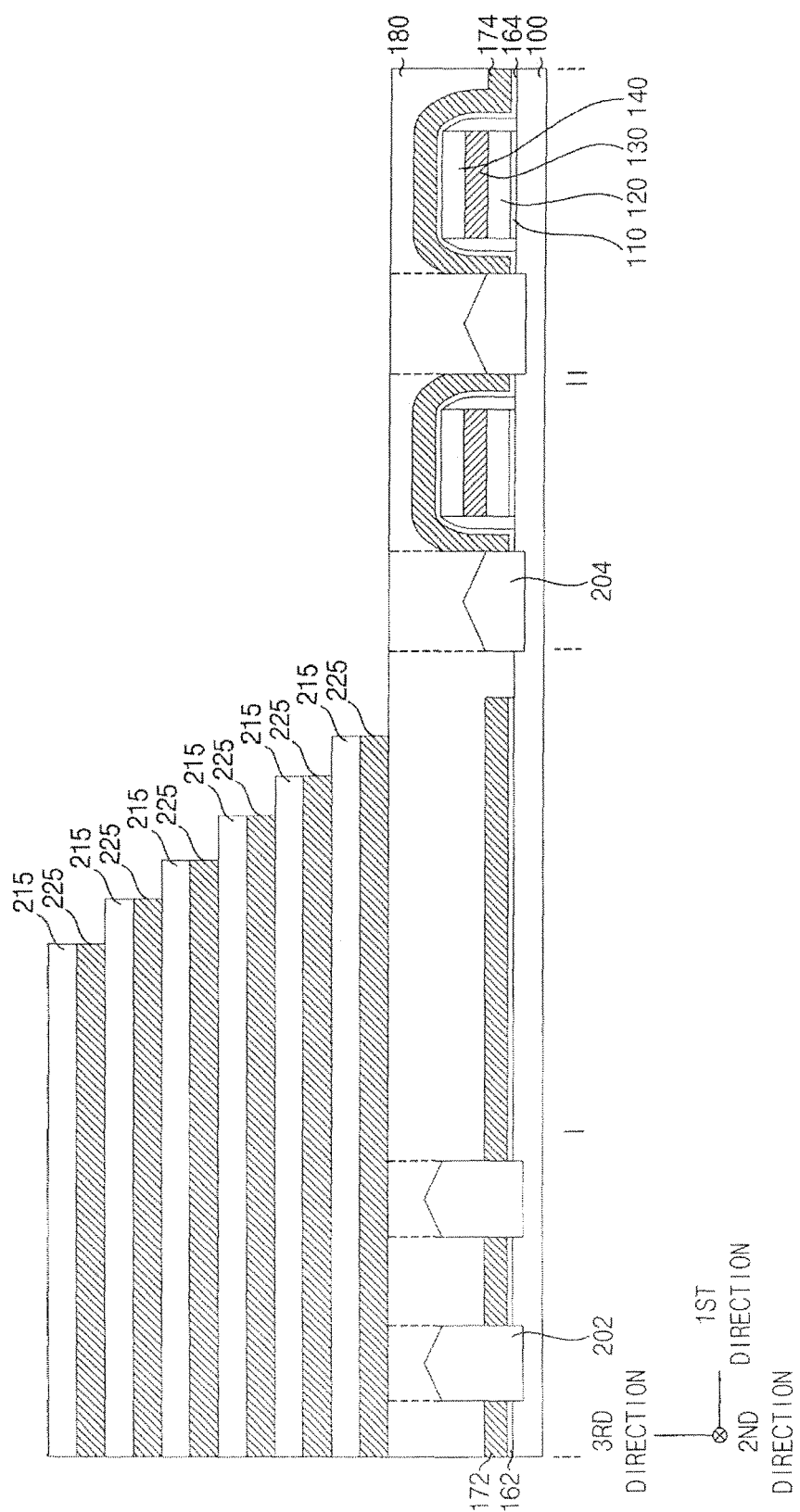

Referring to FIG. 5, a photoresist pattern may be formed on an uppermost one of the second insulation layers 210 to partially cover the uppermost one of the second insulation layers 210, and the uppermost one of the second insulation layers 210 and an uppermost one of the sacrificial layers 220 may be etched using the photoresist pattern as an etching mask. Thus, a portion of one of the second insulation layers 210 under the uppermost one of the sacrificial layers 220 may be exposed. After reducing an area of the photoresist pattern, the uppermost one of the second insulation layers 210, the uppermost one of the sacrificial layers 220, the exposed one of the second insulation layers 210, and one of the sacrificial layers 220 under the exposed one of the second insulation layers 210 may be etched using the reduced photoresist pattern as an etching mask. The above process, which may be referred to as a trimming process, may be repeatedly performed to form a staircase structure including a plurality of steps, each including a second sacrificial pattern 225 and a third insulation pattern 215 sequentially stacked on the first region I of the substrate 100.

In example embodiments, the steps included in the staircase structure may have areas decreasing by a constant ratio from a bottom toward a top thereof. A lowermost one of the steps may have an area smaller than a step including the first insulation pattern 162 and the first sacrificial pattern 172 in a plan view.

Referring to FIG. 6, a third insulating interlayer may be formed on the first insulating interlayer 180 to cover the staircase structure, and may be planarized until an upper surface of the uppermost one of the third insulation patterns 215 is exposed to form a third insulating interlayer pattern 230. The third insulating interlayer may be formed of an oxide, e.g., silicon oxide, and thus the first insulating interlayer pattern 230 may be merged with the third insulation pattern 215 and/or the first insulating interlayer 180.

A fourth insulating interlayer 240 may be formed on an upper surface of the staircase structure and an upper surface of the third insulating interlayer pattern 230. The fourth insulating interlayer 240 may be formed of an oxide, e.g., silicon oxide, and thus may be merged with the third insulating interlayer pattern 230 and/or an uppermost one of the third insulation patterns 215.

A first mask may be formed on the fourth insulating interlayer 240, and the fourth insulating interlayer 240, the third insulation patterns 215, the second sacrificial patterns 225, and the first insulating interlayer 180 may be etched using the first mask as an etching mask to form a channel hole 250 therethrough exposing an upper surface of the first epitaxial layer 202. In example embodiments, a plurality of channel holes 250 may be formed in the second and third directions to form a channel array corresponding to the first opening array.

Referring to FIGS. 7 and 8, after removing the first mask, a first blocking layer, a charge storage layer, a tunnel insulation layer, and a first spacer layer may be sequentially formed on sidewalls of the channel holes 250, upper surfaces of the first epitaxial layer 202, and an upper surface of the fourth insulating interlayer 240. The first spacer layer may be anisotropically etched to form a first spacer on each of the sidewalls of the channel holes 250, and the tunnel insulation layer, the charge storage layer, and the first blocking layer may be etched using the first spacer as an etching mask to form a tunnel insulation pattern 290, a charge storage pattern 280, and a first blocking pattern 270, respectively, on the upper surface of the first epitaxial layer 202 and each of the sidewalls of the channel holes 250, which may have a cup-like shape of which a bottom is opened. During the etching process, an upper portion of the first epitaxial layer 202 may be also partially removed. The tunnel insulation pattern 290, the charge storage pattern 280, and the first blocking pattern 270 may form a charge storage structure 300.

The first blocking layer may be formed of an oxide, e.g., silicon oxide, the charge storage layer may be formed of a nitride, e.g., silicon nitride, the tunnel insulation layer may be formed of an oxide, e.g., silicon oxide, and the first spacer layer may be formed of a nitride, e.g., silicon nitride. After removing the first spacer, a channel layer may be formed on the exposed first epitaxial layer 202, the tunnel insulation pattern 290, and the fourth insulating interlayer 240, and a filling layer may be formed on the channel layer to sufficiently fill remaining portions of the channel holes 250.

The channel layer may be formed of doped or undoped polysilicon or amorphous silicon. When the channel layer includes amorphous silicon, a laser epitaxial growth (LEG) process or a solid phase epitaxy (SPE) process may be further performed so that the channel layer may include crystalline silicon. The filling layer may be formed of an oxide, e.g., silicon oxide. The filling layer and the channel layer may be planarized until an upper surface of the fourth insulating interlayer 240 is exposed to form a filling pattern 320 filling the remaining portion of each of the channel holes 250, and the channel layer is transformed into a channel 310.

Thus, the charge storage structure 300, the channel 310, and the filling pattern 320 may be sequentially stacked on the first epitaxial layer 202 in each of the channel holes 250. The charge storage structure 300 may have a cup-like shape of which a bottom is opened, the channel 310 may have a cup-like shape, and the filling pattern 320 may have a pillar shape.

As the channel holes 250 may form the channel hole array, the channel 310 may also form a channel array correspondingly. The first epitaxial layer 202 may be referred to as a lower channel, and the channel 310 may be referred to as an upper channel.

An upper portion of a first structure including the filling pattern 320, the channel 310, and the charge storage structure 300 may be removed to form a trench, and a capping pattern 330 may be formed to fill the trench. Particularly, after removing the upper portion of the first structure by an etch back process to form the trench, a capping layer filling the trench may be formed on the first structure and the fourth insulating interlayer 240, and an upper portion of the capping layer may be planarized until the upper surface of the fourth insulating interlayer 240 is exposed to form the capping pattern 330. In example embodiments, the capping layer may be formed of doped or undoped polysilicon or amorphous silicon. When the capping layer is formed to include amorphous silicon, a crystallization process may be further performed thereon. The first structure, the first epitaxial layer 202, and the capping pattern 330 in each of the channel holes 250 may be referred to as a second structure.

Figure 9:
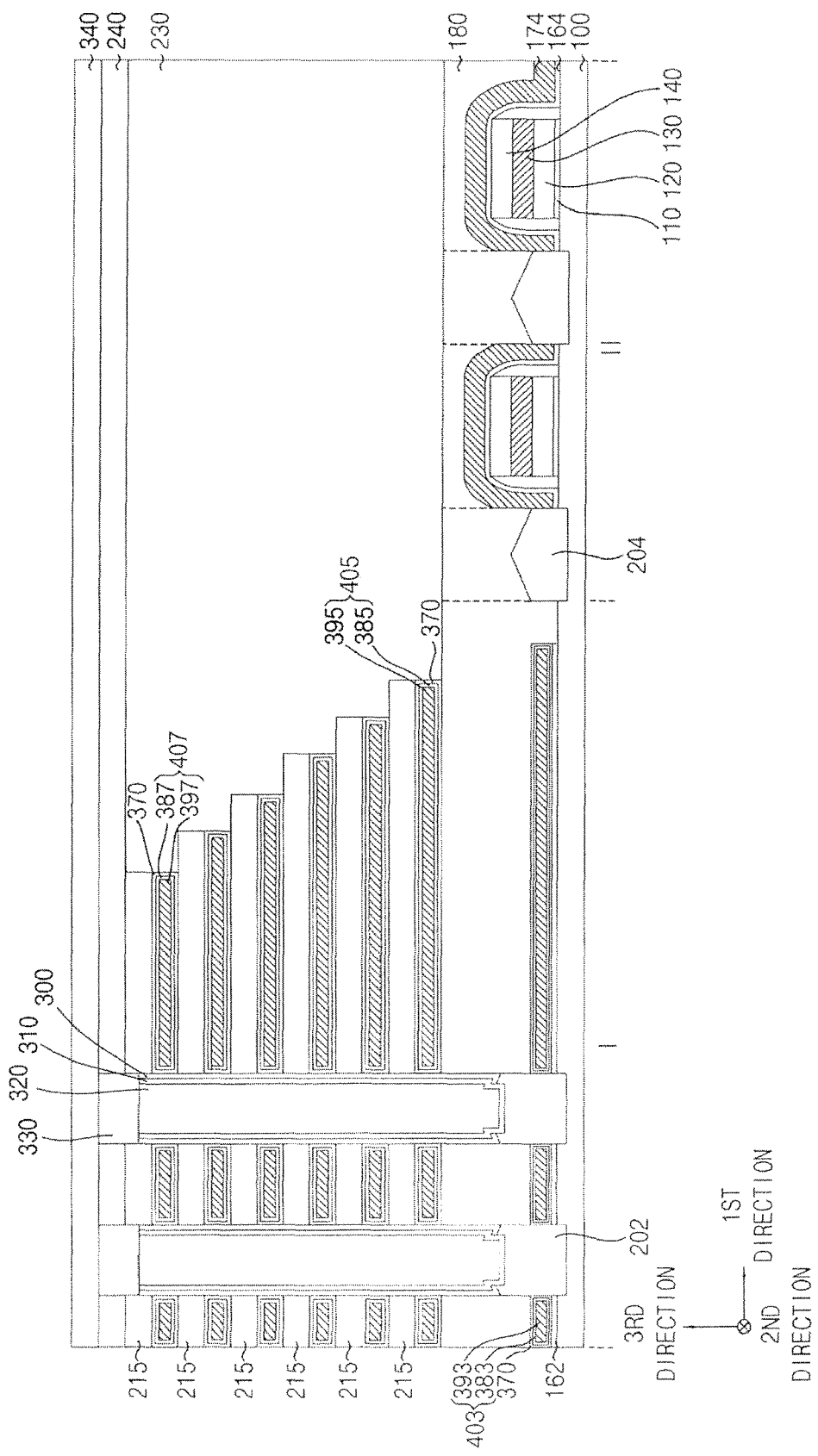

Referring to FIG. 9, a fifth insulating interlayer 340 may be formed on the fourth insulating interlayer 240 and the capping pattern 330. A second mask may be formed on the fifth insulating interlayer 340, and a third opening may be formed through the fourth and fifth insulating interlayers 240 and 340, the third insulation patterns 215, and the second sacrificial patterns 225 to expose an upper surface of the substrate 100. The fifth insulating interlayer 340 may be formed of an oxide, e.g., silicon oxide, and thus may be merged with the fourth insulating interlayer 240. In example embodiments, the third opening may extend in the first direction on the first region I of the substrate 100, and a plurality of third openings may be formed in the second direction.

After removing the second mask, the first and second sacrificial patterns 172 and 225 exposed by the third opening may be removed to form a gap between the third insulation patterns 215 at respective levels and the first insulation pattern 162 and the first insulating interlayer 180, and a portion of an outer sidewall of the first blocking pattern 270 and a portion of a sidewall of the first epitaxial layer 202 may be exposed by the gap. In example embodiments, the first and second sacrificial patterns 172 and 225 exposed by the gap may be removed by a wet etching process using an etchant including, e.g., phosphoric acid or sulfuric acid.

After a second blocking layer 370 may be formed on the exposed portion of the outer sidewall of the first blocking pattern 270, the exposed portion of the sidewall of the first epitaxial layer 202, an inner wall of the gap, surfaces of the first and third insulation patterns 162 and 215, the exposed upper surface of the substrate 100, and an upper surface of the fifth insulating interlayer 340, a gate barrier layer may be formed on the second blocking layer 370, and a gate conductive layer may be formed on the gate barrier layer to sufficiently fill a remaining portion of the gap.

The second blocking layer 370 may be formed of a metal oxide, e.g., aluminum oxide, hafnium oxide, lanthanum oxide, lanthanum aluminum oxide, lanthanum hafnium oxide, hafnium aluminum oxide, titanium oxide, tantalum oxide and/or zirconium oxide. The gate conductive layer may be formed of a metal having a low resistance, e.g., tungsten, titanium, tantalum, platinum, etc., and the gate barrier layer may be formed of a metal nitride, e.g., titanium nitride, tantalum nitride, etc. Alternatively, the gate barrier layer may be formed to have a first layer including a metal and a second layer including a metal nitride layer sequentially stacked.

The gate conductive layer and the gate barrier layer may be partially removed to form a gate conductive pattern and a gate barrier pattern, respectively, in the gap, which may form a cell gate electrode. In example embodiments, the gate conductive layer and the gate barrier layer may be partially removed by a wet etching process.

In example embodiments, the cell gate electrode may be formed to extend in the first direction, and a plurality of cell gate electrodes may be formed in the second direction. That is, a plurality of cell gate electrodes each extending in the first direction may be spaced apart from each other in the second direction by the third opening.

Each of opposite ends of the cell gate electrode in the first direction may be referred to as a pad. A plurality of cell gate electrodes may be formed to be spaced apart from each other in the third direction, and each of the cell gate electrodes may extend in the first direction on the first region I of the substrate 100. Lengths of the cell gate electrodes in the first direction may decrease from a lower level toward an upper level, and thus may have a staircase shape.

The cell gate electrode may include second, third, and fourth gate electrodes 403, 405, and 407 sequentially stacked in the third direction. The second gate electrode 403 may serve as a ground selection line (GSL), the third gate electrode 405 may serve as a word line, and the fourth gate electrode 407 may serve as a string selection line (SSL). The second gate electrode 403 may be formed at a lowermost level, and each of the third and fourth gate electrodes 405 and 407 may be formed at a single level or a plurality of levels. In example embodiments, the fourth gate electrode 407 may be formed at an uppermost level and a level under the uppermost level, and the third gate electrode 405 may be formed at even levels between the second and fourth gate electrodes 403 and 407.

Thus, the second gate electrode 403 may be formed adjacent the first epitaxial layer 202, and each of the third and fourth gate electrodes 405 and 407 may be formed adjacent the channel 310. That is, the first epitaxial layer 202 may serve as a channel of a GST including the second gate electrode 403, and the channel 310 may serve as a channel of a cell transistor including the third gate electrode 405 and an SST including the fourth gate electrode 407, respectively.

The second gate electrode 403 may include a second gate conductive pattern 393 and a second gate barrier pattern 383 covering lower and upper surfaces and a portion of a sidewall of the second gate conductive pattern 393, the third gate electrode 405 may include a third gate conductive pattern 395 and a third gate barrier pattern 385 covering lower and upper surfaces and a portion of a sidewall of the third gate conductive pattern 395, and the fourth gate electrode 407 may include a fourth gate conductive pattern 397 and a fourth gate barrier pattern 387 covering lower and upper surfaces and a portion of a sidewall of the fourth gate conductive pattern 392.

Impurities may be implanted into an upper portion of the substrate 100 exposed by the third opening to form a second impurity region (not shown). In example embodiments, the impurities may include n-type impurities, e.g., phosphorus, arsenic, etc.

A second spacer layer may be formed on the exposed upper surface of the third opening, a sidewall of the third opening, and an upper surface of the fifth insulating interlayer 340, and the second spacer layer may be anisotropically etched to form a second spacer on the sidewall of the third opening. Thus, a portion of the second impurity region at an upper portion of the substrate 100 may be exposed. The second spacer layer may be formed of an oxide, e.g., silicon oxide. A common source line (CSL) may be formed on the exposed second impurity region to fill a remaining portion of the third opening.

In example embodiments, a conductive layer may be formed on the exposed upper surface of the second impurity region, the second spacer, and the fifth insulating interlayer 340 to sufficiently fill a remaining portion of the third opening, and may be planarized until an upper surface of the fifth insulating interlayer 340 may be exposed to form the CSL. A portion of the second blocking layer on the fifth insulating interlayer 340 may be also removed. The conductive layer may be formed of, e.g., a metal, a metal nitride and/or a metal silicide. The CSL may be formed in the third opening, and may contact the upper surface of the second impurity region.

Figure 10:
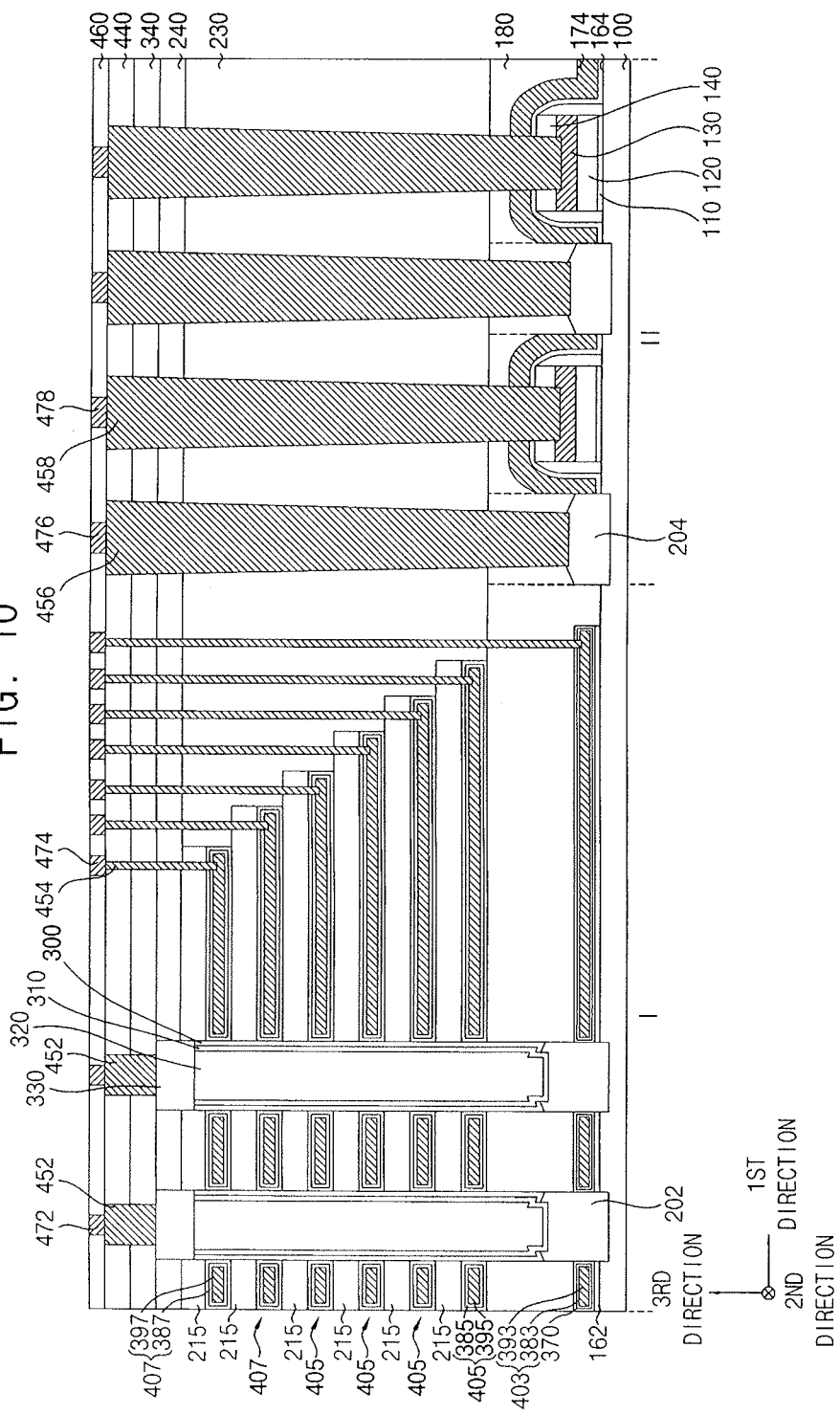

Referring to FIG. 10, a sixth insulating interlayer 440 may be formed on the fifth insulating interlayer 340, the CSL, the second spacer, and the second blocking layer 370. First contact plugs 452 may be formed through the fifth and sixth insulating interlayers 340 and 440 to contact upper surfaces of the capping patterns 330, respectively, second contact plugs 454 may be formed through the fourth to sixth insulating interlayers 240, 340 and 440, the third insulation pattern 215, the second blocking layer 370, and the gate barrier patterns 383, 385 and 387 to contact upper surfaces of the gate conductive patterns 393, 395 and 397, respectively, a third contact plug 456 may be formed through the first insulating interlayer 180, the third insulating interlayer pattern 230, and the fourth to sixth insulating interlayers 240, 340 and 440 to contact an upper surface of the second epitaxial layer 204, and a fourth contact plug 458 may be formed through the first insulating interlayer 180, the third insulation pattern 230, the fourth to sixth insulating interlayers 240, 340 and 440, the etch stop pattern 174, the second insulation pattern 164, and the first gate mask 140 to contact an upper surface of the first metal pattern 130.

Each of the second contact plugs 454 may be formed on each of the pads of the staircase structure. That is, each of the second contact plugs 454 may be formed on a portion of each pad not covered by upper pads.

The sixth insulating interlayer 440 may be formed of an oxide, e.g., silicon oxide, and thus may be merged with the underlying fifth insulating interlayer 340. The first to fourth contact plugs 452, 454, 456 and 458 may be formed of a metal, e.g., tungsten, tantalum, titanium, etc., or a metal nitride, e.g., titanium nitride, tantalum nitride, tungsten nitride, etc.

A seventh insulating interlayer 460 may be formed on the sixth insulating interlayer 440 and the first to fourth contact plugs 452, 454, 456 and 458, and first to fourth wirings 472, 474, 476 and 478 may be formed through the seventh insulating interlayer 460 to contact upper surfaces of the first to fourth contact plugs 452, 454, 456 and 458, respectively. In example embodiments, the first wirings 472 may extend in the second direction, and may serve as a bit line of the vertical memory device.

The seventh insulating interlayer 460 may be formed of an oxide, e.g., silicon oxide, and thus may be merged with the underlying sixth insulating interlayer 440. The first to fourth wirings 472, 474, 476 and 478 may be formed of a metal, e.g., tungsten, tantalum, titanium, etc., or a metal nitride, e.g., titanium nitride, tantalum nitride, tungsten nitride, etc.

As described above, in the method of manufacturing the vertical memory device in accordance with example embodiments, the first epitaxial layer 202 serving as a channel of a GST in the cell region and the second epitaxial layer 204 serving as a source/drain layer of a transistor in the peripheral circuit region may be formed, e.g., simultaneously, by the same SEG process, and thus the entire processes may be simplified, e.g., as compared to forming the different epitaxial layers by separate and independent processes.

The vertical memory device may include the first gate structure with the first gate electrode 122 having the first polysilicon pattern 120 and the first metal pattern 130 on the peripheral circuit region of the substrate 100, the second to fourth gate electrodes 403, 405 and 407 at a plurality of levels, respectively, on the cell region of the substrate 100, the first epitaxial layer 202 extending through the second gate electrode 403 on the cell region of the substrate 100, the channel 310 extending through the third and fourth gate electrodes 405 and 407 in the vertical direction on the first epitaxial layer 202, and the second epitaxial layer 204 on a portion of the peripheral circuit region of the substrate 100 adjacent the first gate structure. The first and second epitaxial layers 202 and 204 may be formed by the same SEG process, and thus, may include substantially the same material, e.g., the first and second epitaxial layers 202 and 204 may consist essentially of the same material.

The vertical memory device may further include the etch stop pattern 174 on a surface of the first gate structure. The etch stop pattern 174 on the second region II of the substrate 100 may be formed by the same process to the same thickness as those of the first sacrificial pattern 172 on the first region I of the substrate 100, and thus a sum of thicknesses of the second gate electrode 403 and the second blocking pattern 370 covering lower and upper surfaces of the second gate electrode 403, which may fill the gap formed by removing the first sacrificial pattern 172, may be substantially equal to a thickness of the etch stop pattern 174.

FIGS. 11 to 14 are cross-sectional views illustrating stages of a method of manufacturing a vertical memory device in accordance with example embodiments. This method may include processes substantially the same as or similar to those illustrated with reference to FIGS. 1 to 10, and thus like reference numerals refer to like elements, and detailed descriptions thereon are omitted herein.

Figure 11:
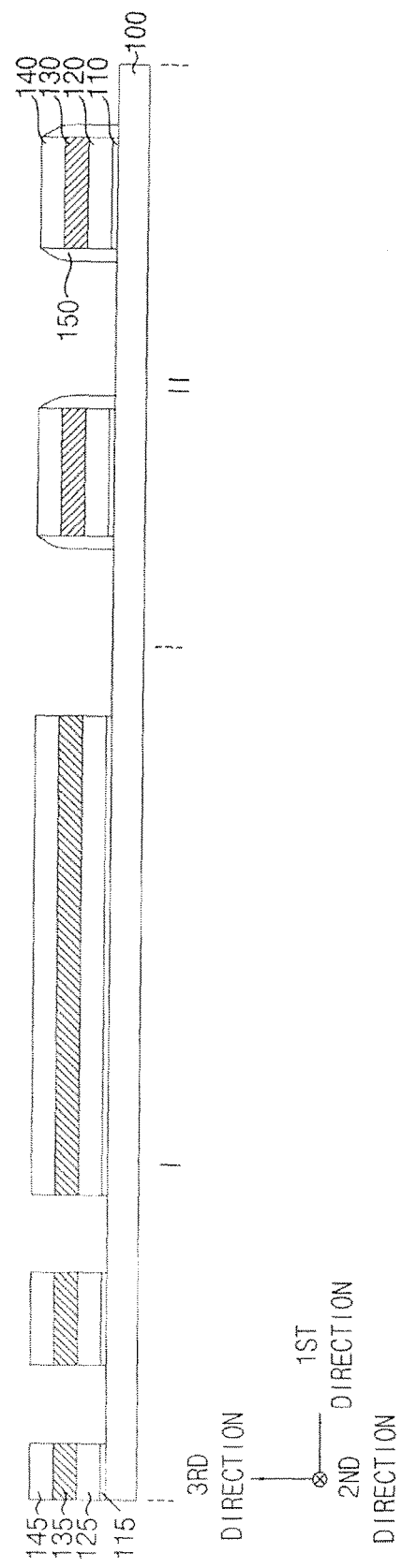
FIGS. 11 to 14 illustrate cross-sectional views of stages in a method of manufacturing a vertical memory device in accordance with example embodiments.

Referring to FIG. 11, the first gate structure and the gate spacer 150 may be formed on the second region II of the substrate 100 including the first and second regions I and II, and a second gate structure may be formed on the first region I of the substrate 100.

Particularly, a gate insulation layer, a polysilicon layer, a metal layer, and a gate mask layer may be sequentially stacked on the substrate 100, and patterned to form the first gate structure including the gate insulation pattern 110, the first polysilicon pattern 120, the first metal pattern 130, and the first gate mask 140 sequentially stacked on the second region II of the substrate 100, and to form the second gate structure including a fourth insulation pattern 115, a second polysilicon pattern 125, a second metal pattern 135, and a second gate mask 145 sequentially stacked on the first region I of the substrate 100.

The first gate structure may include the first gate electrode 122 having the first polysilicon pattern 120 and the first metal pattern 130 sequentially stacked, and the second gate structure may include a fifth gate electrode having the second polysilicon pattern 125 and the second metal pattern 135 sequentially stacked.

A fourth opening may be formed in the second gate structure to expose an upper surface of the substrate 100, a plurality of fourth openings may be formed in the first and second directions to form a fourth opening array as the first opening 192 illustrated with reference to FIG. 3.

The gate spacer 150 may be further formed on a sidewall of the first gate structure on the second region II of the substrate 100.

Figure 12:
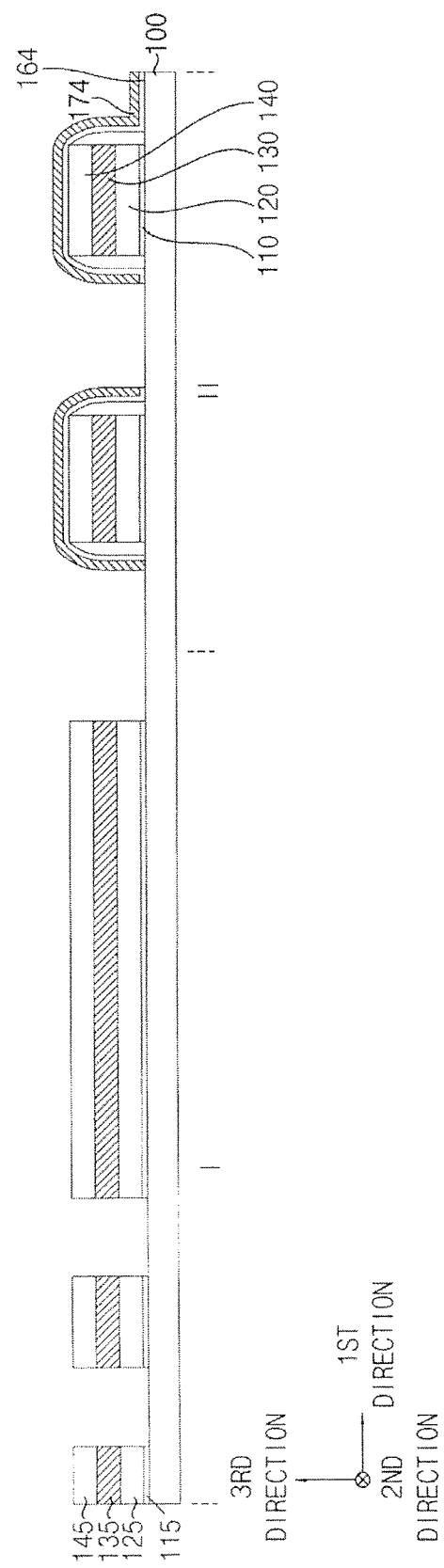

Referring to FIG. 12, processes substantially the same as or similar to those illustrated with reference to FIG. 2 may be performed.

However, the first insulation pattern 162 and the first sacrificial pattern 172 may not be formed on the first region I of the substrate 100, and the second insulation pattern 164 and the etch stop pattern 174 may be sequentially formed on the second region II of the substrate 100 to cover the second gate structure.

Impurities may be implanted into an upper portion of the second region II of the substrate 100 not covered by the second insulation pattern 164 and the etch stop pattern 174 to form a first impurity region (not shown).

Figure 13:
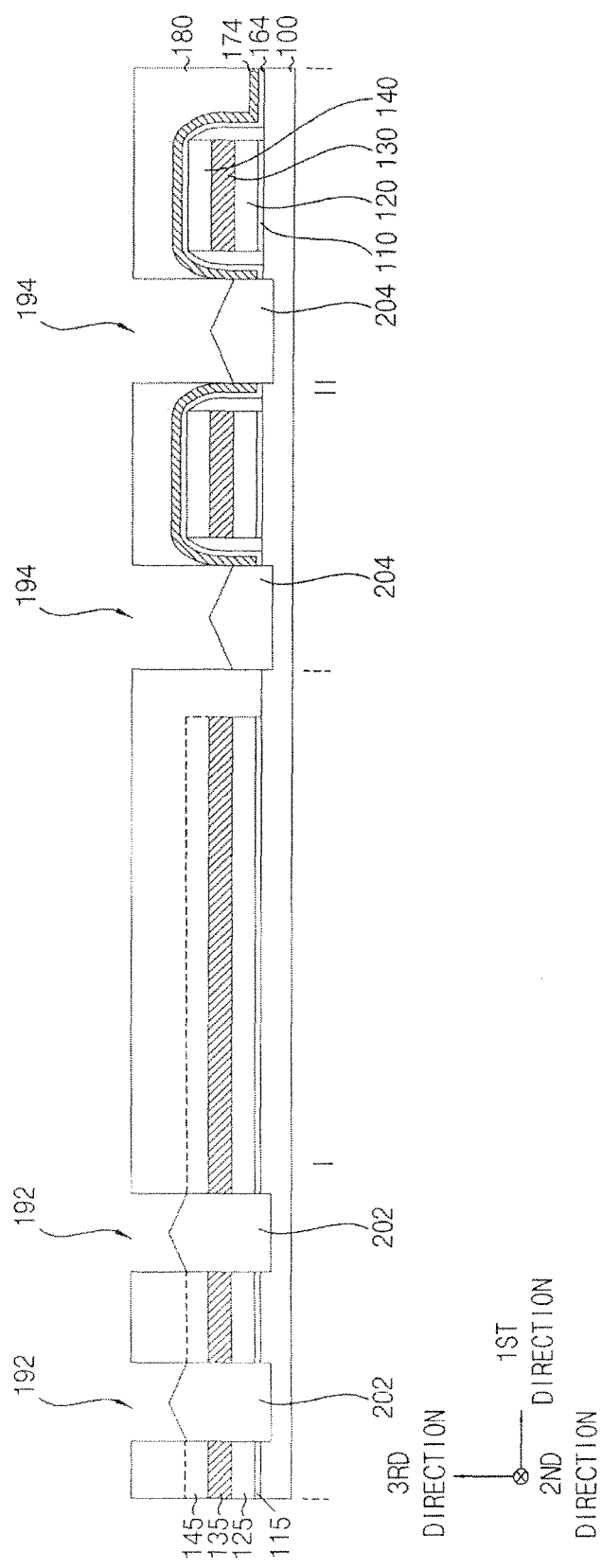

Referring to FIG. 13, processes substantially the same as or similar to those illustrated with reference to FIG. 3 may be performed.

Thus, the first insulating interlayer 180 may be formed on the substrate 100 to cover the first and second gate structures, the second insulation pattern 164, and the etch stop pattern 174, a portion of the first insulating interlayer 180 on the first region I of the substrate 100 to form the first opening 192 exposing a portion of the first region I of the substrate 100, and a portion of the second region II of the substrate 100 to form the second opening 194 exposing a portion of the second region II of the substrate 100.

That is, the first opening 192 may be formed to overlap the third opening in the second gate structure, and the second opening 194 may be formed by removing a portion of the first insulating interlayer 180 adjacent the second gate structure under which the second insulation pattern 164 and the etch stop pattern 174 are not formed on the second region II of the substrate 100.

A SEG process may be performed to form the first and second epitaxial layers 202 and 204 partially filling the first and second openings 192 and 194, respectively. The first insulating interlayer 180 may be formed of a material substantially the same as that of the second gate mask 145 on the first region I of the substrate 100, and thus may be merged therewith.

Figure 14:
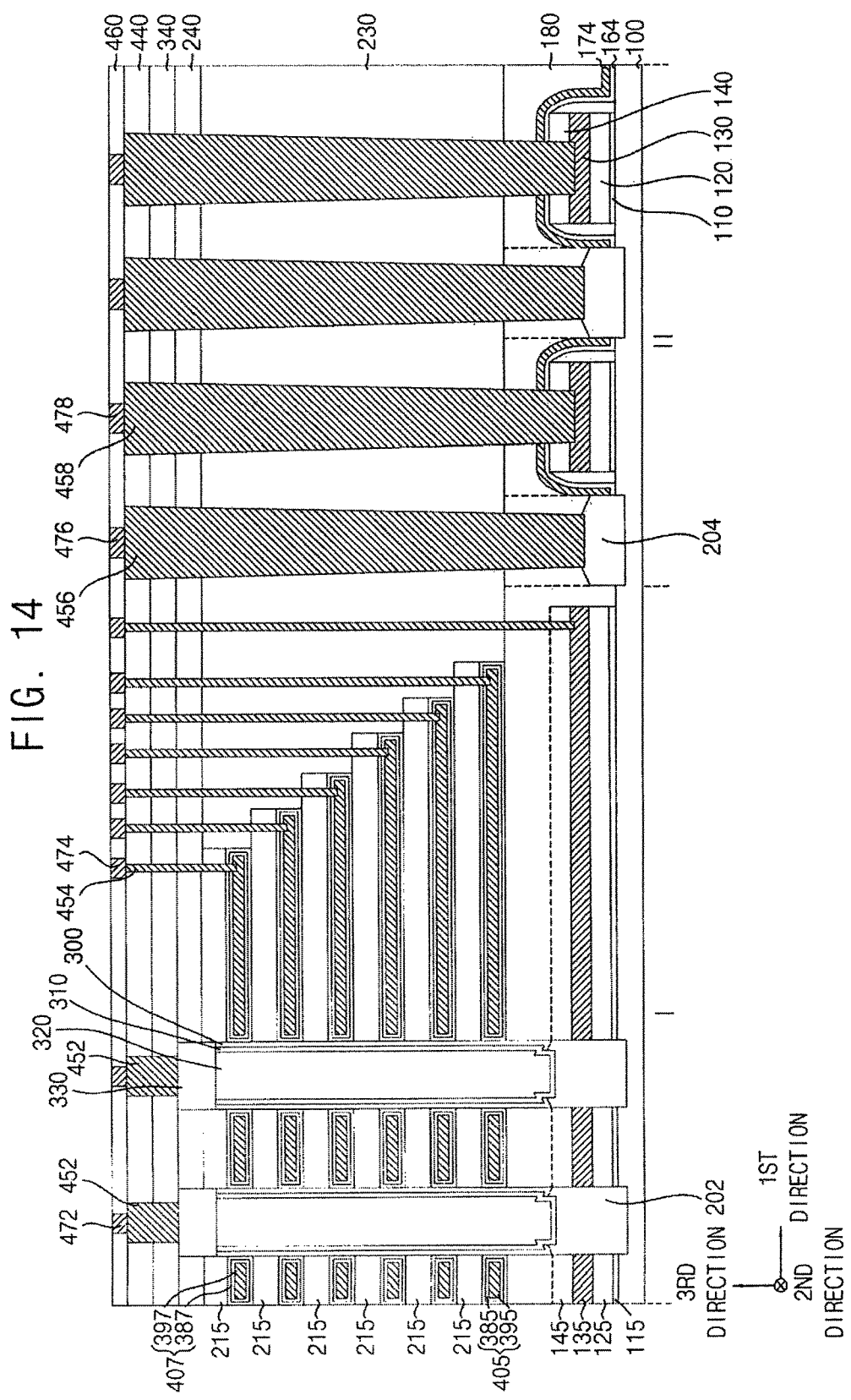

Referring to FIG. 14, processes substantially the same as or similar to those illustrated with reference to FIGS. 4 to 10 may be performed to complete the vertical memory device.

However, the fifth gate structure included in the second gate structure may include the second polysilicon pattern 125 and the second metal pattern 135 sequentially stacked, and thus may not be removed in the process for forming the gap by removing the second sacrificial patterns 225 illustrated with reference to FIG. 9. Thus, the fifth gate structure may have different structure from those of the third and fourth gate electrodes 405 and 407 filling the gap.

As illustrated above, in the method of manufacturing the vertical memory device, the first epitaxial layer 202 serving as a channel of a GST in the cell region and the second epitaxial layer 204 serving as a source/drain layer of a transistor in the peripheral circuit region may be simultaneously formed by the same SEG process. Thus, the whole processes may be simplified.

The vertical memory device may include the first gate structure with the first gate electrode 122 having the first polysilicon pattern 120 and the first metal pattern 130 on the peripheral circuit region of the substrate 100, the fifth gate electrode and the third and fourth gate electrodes 405 and 407 sequentially stacked on the cell region of the substrate 100, the first epitaxial layer 202 extending through the fifth gate electrode on the cell region of the substrate 100, the channel 310 extending through the third and fourth gate electrodes 405 and 407 in the vertical direction on the first epitaxial layer 202, and the second epitaxial layer 204 on the peripheral circuit region of the substrate 100 adjacent the first gate electrode.

In example embodiments, the first gate structure may include the gate insulation pattern 110, the first gate electrode 122, and the first gate mask 140 sequentially stacked, and the first gate electrode 122 may include the first polysilicon pattern 120 and the first metal pattern 130 sequentially stacked. The fifth gate electrode may include the second polysilicon pattern 125 and the second metal pattern 135 sequentially stacked. The first and second polysilicon patterns 120 and 125 may have substantially the same thickness, and the first and second metal patterns 130 and 135 may have substantially the same thickness and metal.

By way of summation and review, example embodiments provide a vertical memory device having good characteristics. That is, in the method of manufacturing the vertical memory device in accordance with example embodiments, the first epitaxial layer serving as a channel of a GST on the cell region and the second epitaxial layer serving as a source/drain region of a transistor on the peripheral circuit region may be formed by the same SEG process, and thus the processes for manufacturing the vertical memory device may be simplified.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A vertical memory device, comprising:
a gate structure on a peripheral circuit region of a substrate, the substrate including a cell region and the peripheral circuit region, and the gate structure including a first gate electrode;
second, third, and fourth gate electrodes sequentially disposed at a plurality of levels, respectively, on the cell region of the substrate in a vertical direction substantially perpendicular to an upper surface of the substrate;
a first epitaxial layer extending through the second gate electrode directly on a first portion of the cell region of the substrate;
a channel extending through the third and fourth gate electrodes in the vertical direction on the first epitaxial layer; and
a second epitaxial layer directly on a second portion of the peripheral circuit region of the substrate adjacent the gate structure, the first and second portions of the cell region and the peripheral circuit region, respectively, of the substrate including undoped single crystalline semiconductor material,
wherein lower surfaces of the first and second epitaxial layers are level with each other.

2. The vertical memory device as claimed in claim 1, wherein the first and second epitaxial layers include substantially the same material.

3. The vertical memory device as claimed in claim 2, wherein the first and second epitaxial layers include silicon-germanium doped with p-type impurities.

4. The vertical memory device as claimed in claim 1, wherein an upper surface of the first epitaxial layer is higher than an upper surface of the second epitaxial layer.

5. The vertical memory device as claimed in claim 1, further comprising an etch stop pattern on a surface of the gate structure, the etch stop pattern including a nitride, and a thickness of the etch stop pattern is greater than a thickness of the second gate electrode.

6. The vertical memory device as claimed in claim 5, further comprising a blocking pattern covering at least lower and upper surfaces of the second gate electrode, wherein the thickness of the etch stop pattern is substantially equal to a sum of the thickness of the second gate electrode and a thickness of the blocking pattern covering the lower and upper surfaces of the second gate electrode.

7. The vertical memory device as claimed in claim 1, wherein the gate structure includes a gate insulation pattern, the first gate electrode, and a gate mask, the first gate electrode including a first polysilicon pattern and a first metal pattern sequentially stacked.

8. The vertical memory device as claimed in claim 7, wherein the second gate electrode includes a second polysilicon pattern and a second metal pattern sequentially stacked, the first and second metal patterns including substantially the same metal.

9. The vertical memory device as claimed in claim 8, wherein the first and second polysilicon patterns have substantially the same thickness, and the first and second metal patterns have substantially the same thickness.

10. The vertical memory device as claimed in claim 1, wherein the second gate electrode is at a single level, and each of the third and fourth gate electrodes is at a plurality of levels.

11. The vertical memory device as claimed in claim 1, wherein the first epitaxial layer serves as a channel of a transistor including the second gate electrode, and the second epitaxial layer serves as a source/drain layer of a transistor including the first gate electrode.

12. A vertical memory device, comprising:
a gate structure on a peripheral circuit region of a substrate, the substrate including a cell region and the peripheral circuit region, and the gate structure including a first gate electrode;
a source/drain layer on a portion of the peripheral circuit region of the substrate adjacent the gate structure;
second, third, and fourth gate electrodes sequentially disposed at a plurality of levels, respectively, on the cell region of the substrate in a vertical direction substantially perpendicular to an upper surface of the substrate;
a lower channel extending through the second gate electrode on the cell region of the substrate;
an upper channel extending through the third and fourth gate electrodes in the vertical direction on the lower channel;
an etch stop pattern on a surface of the gate structure; and
a blocking pattern covering at least lower and upper surfaces of the second gate electrode,
wherein the lower channel and the source/drain layer include substantially a same material, and
wherein a thickness of the etch stop pattern is substantially equal to a sum of a thickness of the second gate electrode and a thickness of the blocking pattern covering the lower and upper surfaces of the second gate electrode.

13. The vertical memory device as claimed in claim 12, wherein the etch stop pattern includes a nitride.

14. The vertical memory device as claimed in claim 12, wherein:
the gate structure includes a gate insulation pattern, the first gate electrode, and a gate mask,
the first gate electrode includes a first polysilicon pattern and a first metal pattern sequentially stacked, and the second gate electrode includes a second polysilicon pattern and a second metal pattern sequentially stacked, and
the first and second metal patterns include substantially the same metal.

15. The vertical memory device as claimed in claim 14, wherein the first and second polysilicon patterns have substantially the same thickness, and the first and second metal patterns have substantially the same thickness.

16. The vertical memory device as claimed in claim 12, wherein the lower channel and the source/drain layer are epitaxial layers including a same material.

17. A vertical memory device, comprising:
a substrate including a cell region and a peripheral circuit region;
a gate structure on the peripheral circuit region of the substrate, the gate structure including a first gate electrode;
second, third, and fourth gate electrodes on the cell region of the substrate, the second through fourth gate electrodes being spaced apart from each other along a vertical direction substantially perpendicular to an upper surface of the substrate;
a first epitaxial layer extending through the second gate electrode directly on a first portion of the cell region of the substrate;
a channel on the first epitaxial layer, the channel extending through the third and fourth gate electrodes in the vertical direction; and
a second epitaxial layer directly on a second portion of the peripheral circuit region of the substrate, the second epitaxial layer being adjacent the gate structure and consisting essentially of a same material as the first epitaxial layer,
wherein the vertical memory device further comprises:
an etch stop pattern on a surface of the gate structure, and
a blocking pattern covering at least lower and upper surfaces of the second gate electrode, and
wherein a thickness of the etch stop pattern is substantially equal to a sum of a thickness of the second gate electrode and a thickness of the blocking pattern covering the lower and upper surfaces of the second gate.

18. The vertical memory device as claimed in claim 17, wherein each of the first and second epitaxial layers is a single crystalline layer including silicon.

19. The vertical memory device as claimed in claim 17, wherein the first epitaxial layer is a channel of a transistor including the second gate electrode, and the second epitaxial layer is a source/drain layer of a transistor including the first gate electrode.

20. The vertical memory device as claimed in claim 17, wherein an insulating interlayer covers the gate structure, the second epitaxial layer, and the second gate electrode, the channel extending into the insulating interlayer to contact the first epitaxial layer.

* * * * *